(12) United States Patent
Lam

(10) Patent No.: US 9,788,419 B2
(45) Date of Patent: Oct. 10, 2017

(54) EDGE FINGERS OF MULTI-LAYER PRINTED CIRCUIT BOARD

(71) Applicant: SAE Magnetics (H.K.) Ltd., Hong Kong (HK)

(72) Inventor: Fuk Ming Lam, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 34 days.

(21) Appl. No.: 14/933,006

(22) Filed: Nov. 5, 2015

(65) Prior Publication Data

US 2017/0135202 A1   May 11, 2017

(51) Int. Cl.
*H05K 1/02* (2006.01)
*H05K 1/11* (2006.01)
*H01R 12/52* (2011.01)
*H01R 12/50* (2011.01)

(52) U.S. Cl.
CPC ......... *H05K 1/0298* (2013.01); *H05K 1/0216* (2013.01); *H05K 1/0245* (2013.01); *H05K 1/117* (2013.01); *H01R 12/52* (2013.01); *H01R 23/70* (2013.01); *H01R 23/7068* (2013.01); *H05K 1/0219* (2013.01)

(58) Field of Classification Search
CPC .......................... H05K 1/0298; H05K 1/0245
See application file for complete search history.

(56) References Cited

U.S. PATENT DOCUMENTS

| 3,818,117 | A | * | 6/1974 | Reyner, II | H01B 7/0838 174/117 FF |
| 6,425,766 | B1 | * | 7/2002 | Panella | H05K 1/117 439/59 |
| 6,710,266 | B2 | * | 3/2004 | Mix | H05K 1/117 174/255 |
| 7,244,126 | B2 | * | 7/2007 | Morana | H01R 13/6658 439/76.1 |
| 7,453,338 | B2 |  | 11/2008 | Aronson |  |
| 2001/0034156 | A1 | * | 10/2001 | Yamane | H01R 13/641 439/492 |

* cited by examiner

Primary Examiner — Ishwarbhai B Patel

(57) ABSTRACT

A multi-layer printed circuit board includes an insertion end, two edge fingers provided on the insertion end, two chamfers formed at two opposite inner corners at two trailing edges of the two edge fingers, and two single-ended transmission lines extending from the two trailing edges of the two edge fingers and converging towards each other to form a differential pair. A first ground reference plane is disposed underneath the two single-ended transmission lines and the differential pair with a leading edge terminates at the trailing edges of the two edge fingers and a first cut-out portion formed at the leading edge. Other ground reference planes are disposed underneath the first ground reference plane with leading edges terminate at the trailing edges of the edge fingers and second cut-out portions are formed at the leading edges, wherein the second cut-out portions are larger than the first cut-out portion.

16 Claims, 10 Drawing Sheets

EDGE FINGERS OF MULTI-LAYER PRINTED CIRCUIT BOARD

FIELD OF THE TECHNOLOGY

The present application relates to edge fingers of a multi-layer printed circuit board.

BACKGROUND

Edge fingers are electrically conductive fingers formed on one or both sides of an edge portion of a multi-layer printed circuit board. The printed circuit board is insertable into a socketed connector provided on an electronic device such as a computer. The socketed connector is usually provided with resiliently deflectable metal contact strips which are positioned and configured to engage the edge fingers of the printed circuit board to thereby electrically couple the circuitry of the printed circuit board and the electronic device. Ideally, socketed connector should have impedance characteristics that are identical, or very close, to those of the printed circuit board (PCB) transmission lines and components connected. However, for known prior art, impedance mismatch would occur between PCB transmission lines, gold finger region in particular, and the socketed connector. Then, signal quality could be degraded. Therefore, there is a need to provide an improved edge finger structure of a multi-layer printed circuit board.

The above description of the background is provided to aid in understanding the edge fingers of a multi-layer printed circuit board, but is not admitted to describe pertinent prior art of the edge fingers of a multi-layer printed circuit board. The above description also does not constitute pertinent prior art to the edge fingers of a multi-layer printed circuit board, or does not consider any cited documents as material to the patentability of the claims of the present application.

SUMMARY

According to one aspect, there is provided a multi-layer printed circuit board that may include an insertion end having upper and lower surfaces; two edge fingers provided side-by-side on one of the surfaces of the insertion end, each edge finger having a leading edge and a trailing edge; two chamfers formed at two opposite inner corners at the two trailing edges of the two edge fingers respectively; two single-ended transmission lines extending from the two trailing edges of the two edge fingers adjacent to the two chamfers respectively, and converging towards each other to form a differential pair at a distance from the trailing edges of the two edge fingers; a first ground reference plane disposed at an inner side of a plane on which the two edge fingers, the two single-ended transmission lines and the differential pair are disposed, and a leading edge of the first ground reference plane being terminated at the trailing edges of the two edge fingers, wherein a first cut-out portion is formed at the leading edge of the first ground reference plane; and at least one second ground reference plane disposed at an inner side of the first ground reference plane, and a leading edge of the or each second ground reference plane being terminated at the trailing edges of the two edge fingers, wherein a second cut-out portion is formed at the leading edge of the or each second ground reference plane at an inner side of the first cut-out portion, and the second cut-out portion is larger than the first cut-out portion.

According to another aspect, there is provided a multi-layer printed circuit board that may include an insertion end having upper and lower surfaces; two edge fingers provided side-by-side on one of the surfaces of the insertion end, each edge finger having a leading edge and a trailing edge; two chamfers formed at two opposite inner corners at the two trailing edges of the two edge fingers respectively; and two single-ended transmission lines extending from the two trailing edges of the two edge fingers adjacent to the two chamfers respectively, and converging towards each other to form a differential pair at a distance from the trailing edges of the two edge fingers.

The multi-layer printed circuit board may further include a first ground reference plane disposed at an inner side of a plane on which the two edge fingers, the two single-ended transmission lines and the differential pair are disposed, and a leading edge of the first ground reference plane being terminated at the trailing edges of the two edge fingers. A first cut-out portion may be formed at the leading edge of the first ground reference plane.

The multi-layer printed circuit board may further include at least one second ground reference plane disposed at an inner side of the first ground reference plane, and a leading edge of the or each second ground reference plane being terminated at the trailing edges of the two edge fingers.

In one embodiment, a second cut-out portion may be formed at the leading edge of the or each second ground reference plane at an inner side of the first cut-out portion, and the second cut-out portion is larger than the first cut-out portion.

In one embodiment, the first and the second cut-out portions can be disposed at an inner side of the two single-ended transmission lines. The first and the second cut-out portions may be rectangular in shape.

In one embodiment, an edge finger region below the edge fingers and between the trailing edges of the edge fingers and a leading edge of the insertion end is free of metal.

In one embodiment, the two single-ended transmission lines may extend from two opposite outer corners at the trailing edges of the two edge fingers, and two opposite outer side edges of the two single-ended transmission lines are in alignment with two opposite outer side edges of the two edge fingers respectively. The two single-ended transmission lines may extend from middle portions of the two trailing edges of the two edge fingers respectively.

The multi-layer printed circuit board may further include two additional edge fingers provided side-by-side on an opposite one of the surfaces of the insertion end, each additional edge finger having a leading edge and a trailing edge; two additional chamfers formed at two opposite inner corners at the two trailing edges of the two additional edge fingers respectively; and two additional single-ended transmission lines extending from the two trailing edges of the two additional edge fingers adjacent to the two additional chamfers respectively, and converging towards each other to form an additional differential pair at a distance from the trailing edges of the two additional edge fingers.

The multi-layer printed circuit board may further include an additional first ground reference plane disposed at an inner side of a plane on which the two additional edge fingers, the two additional single-ended transmission lines and the additional differential pair are disposed, and a leading edge of the additional first ground reference plane being terminated at the trailing edges of the two additional edge fingers.

In one embodiment, an additional first cut-out portion can be formed at the leading edge of the additional first ground reference plane.

The multi-layer printed circuit board may further include at least one additional second ground reference plane disposed at an inner side of the additional first ground reference plane, and a leading edge of the or each additional second ground reference plane being terminated at the trailing edges of the two additional edge fingers.

In one embodiment, an additional second cut-out portion may be formed at the leading edge of the or each additional second ground reference plane at an inner side of the additional first cut-out portion, and the additional second cut-out portion is larger than the additional first cut-out portion.

The multi-layer printed circuit board may further include a middle ground plane provided between the at least one second ground reference plane and the at least one additional ground reference plane, a leading edge of the middle ground plane being terminated at the trailing edges of the two additional edge fingers and being free of cut-out portion.

In one embodiment, the edge fingers, the single-ended transmission lines, the differential pair, and the first and the at least one second ground reference planes can be offset from the additional edge fingers, the additional single-ended transmission lines, the additional differential pair, and the additional first and the at least one additional second ground reference planes in a sideway direction.

In one embodiment, the two additional single-ended transmission lines may extend from two opposite outer corners of the two additional edge fingers, and two opposite outer side edges of the two additional single-ended transmission lines are in alignment with two opposite outer side edges of the two additional edge fingers respectively. The two additional single-ended transmission lines may extend from middle portions of the two trailing edges of the two additional edge fingers respectively.

Although the edge fingers of a multi-layer printed circuit board is shown and described with respect to certain embodiments, it is obvious that equivalents and modifications will occur to others skilled in the art upon the reading and understanding of the specification. The edge fingers of a multi-layer printed circuit board in the present application includes all such equivalents and modifications, and is limited only by the scope of the claims.

BRIEF DESCRIPTION OF THE DRAWINGS

Specific embodiments of the edge fingers of a multi-layer printed circuit board will now be described by way of example with reference to the accompanying drawings wherein:

FIG. 1b is a cross sectional view of the high-speed transceiver and the edge connector socket as shown in FIG. 1a.

DETAILED DESCRIPTION

Figure 1A:
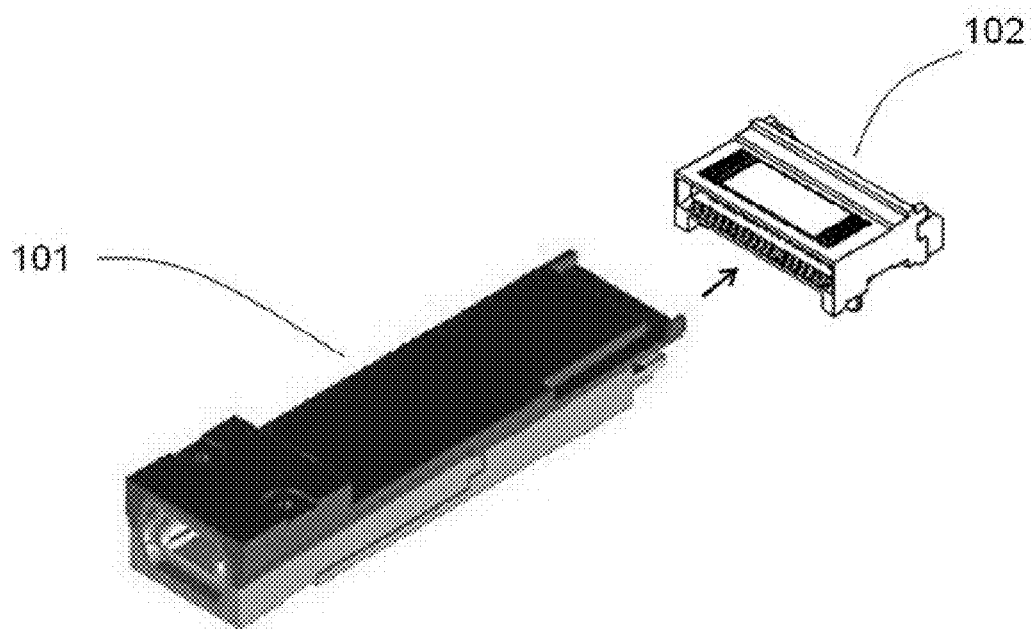
FIG. 1a is a perspective view of a high-speed transceiver and an edge connector socket of the prior art.

Reference will now be made in detail to a preferred embodiment of the edge fingers of a multi-layer printed circuit board, examples of which are also provided in the following description. Exemplary embodiments of the edge fingers of a multi-layer printed circuit board are described in detail, although it will be apparent to those skilled in the relevant art that some features that are not particularly important to an understanding of the edge fingers of a multi-layer printed circuit board may not be shown for the sake of clarity.

Furthermore, it should be understood that the edge fingers of a multi-layer printed circuit board is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure and appended claims.

In addition, improvements and modifications which may become apparent to persons of ordinary skill in the art after reading this disclosure, the drawings, and the appended claims are deemed within the spirit and scope of the protection.

For illustration purposes, the terms such as "upper", "lower", "vertical", "horizontal", "top", "bottom" appeared hereinafter relate to the invention as it is oriented in the drawings. It is understood that the invention may assume various positions, except where expressly specified to the contrary. Furthermore, it is understood that the specific devices shown in the drawings, and described in the following description, are simply exemplary embodiments of the invention. Hence, specific dimensions and other physical characteristics related to the embodiments disclosed hereinafter are not to be considered as limiting.

It should be noted that throughout the specification and claims herein, when one element is said to be "coupled" or "connected" to another, this does not necessarily mean that one element is fastened, secured, or otherwise attached to another element. Instead, the term "coupled" or "connected" means that one element is either connected directly or indirectly to another element or is in mechanical or electrical communication with another element.

Figure 1B:
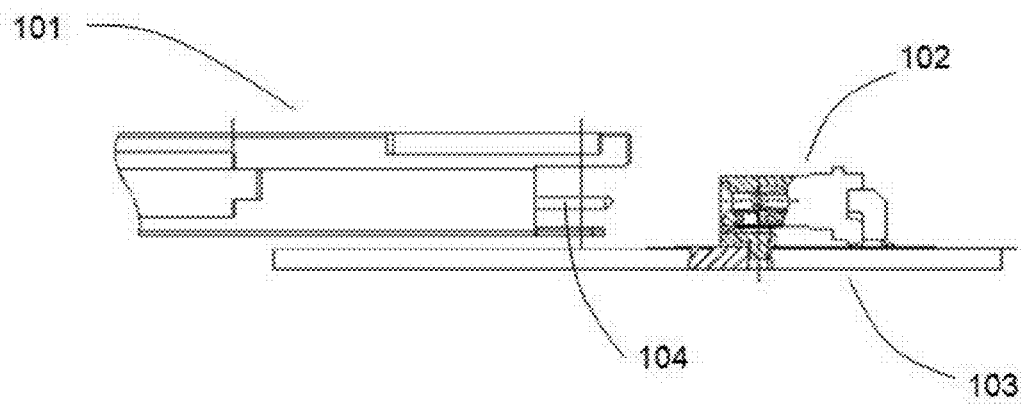

FIGS. 1a and 1b show a high-speed transceiver 101 and an edge connector socket 102. High-speed transceivers 101 usually interface with host motherboard 103 with an edge connector. With an edge connector socket 102, the high-speed transceiver 101 has to equip with edge finger structure at the edge of the transceiver printed circuit board (PCB) 104, so that the transceiver 101 can be inserted into the socket 102.

FIGS. 2a-2e show an edge finger structure of the multi-layer PCB 104 according to an embodiment of the present application. The multi-layer PCB 104 may include an insertion end 220 having upper and lower surfaces, two edge fingers 201 provided side-by-side on one of the surfaces of the insertion end 220, each edge finger 201 having a leading edge 2011 and a trailing edge 2012, two chamfers 202 formed at two opposite inner corners at the two trailing edges 2012 of the two edge fingers 201 respectively, and two single-ended high-speed transmission lines 214 extending from the two trailing edges 2012 of the two edge fingers 201 adjacent to the two chamfers 202 respectively, and converging towards each other to form a differential pair 213 at a distance from the trailing edges 2012 of the two edge fingers 201.

As used herein, the term "leading edge" of an element on the PCB is an edge of the element facing a connector socket when the PCB is being inserted into the socket, and the term "trailing edge" is an edge opposite to the leading edge.

The multi-layer PCB 104 may further include a first ground reference plane 206 disposed at an inner side of a plane on which the two edge fingers 201, the two single-ended transmission lines 214 and the differential pair 213 are disposed. A leading edge of the first ground reference plane 206 may terminate at the trailing edges 2012 of the two edge fingers 201. A first cut-out portion 210 may be formed at the leading edge of the first ground reference plane 206.

The multi-layer PCB 104 may further include at least one second ground reference plane 207, 208 disposed at an inner side of the first ground reference plane 206, and a leading edge of the or each second ground reference plane 207, 208 may terminate at the trailing edges 2012 of the two edge fingers 201. A second cut-out portion 211, 212 may be formed at the leading edge of the or each second ground reference plane 207, 208 at an inner side of the first cut-out portion 210. The second cut-out portion 211, 212 is larger than the first cut-out portion 210.

The first and the second cut-out portions 210, 211, 212 may be disposed at an inner side of the two single-ended high-speed transmission lines 214. The first and the second cut-out portions 210, 211, 212 may be rectangular in shape or in any other appropriate shape.

An edge finger region 217 below the edge fingers 201 and between the trailing edges 2012 of the edge fingers 201 and a leading edge 215 of the insertion end 220 is free of metal.

In one embodiment, the two single-ended high-speed transmission lines 214 may extend from two opposite outer corners at the trailing edges 2012 of the two edge fingers 201, and two opposite outer side edges of the two single-ended transmission lines 214 may be in alignment with two opposite outer side edges of the two edge fingers 201 respectively. In another embodiment, the two single-ended high-speed transmission lines 214 may extend from the middle portions of the two trailing edges 2012 of the two edge fingers 201 respectively.

The multi-layer PCB 104 may have at least 3 metal layers. Top layer (also the first metal layer) of the PCB 104 may contain the edge fingers 201, two longer edge fingers 203, the single-ended transmission lines 214 and the differential pair 213.

Figure 2A:
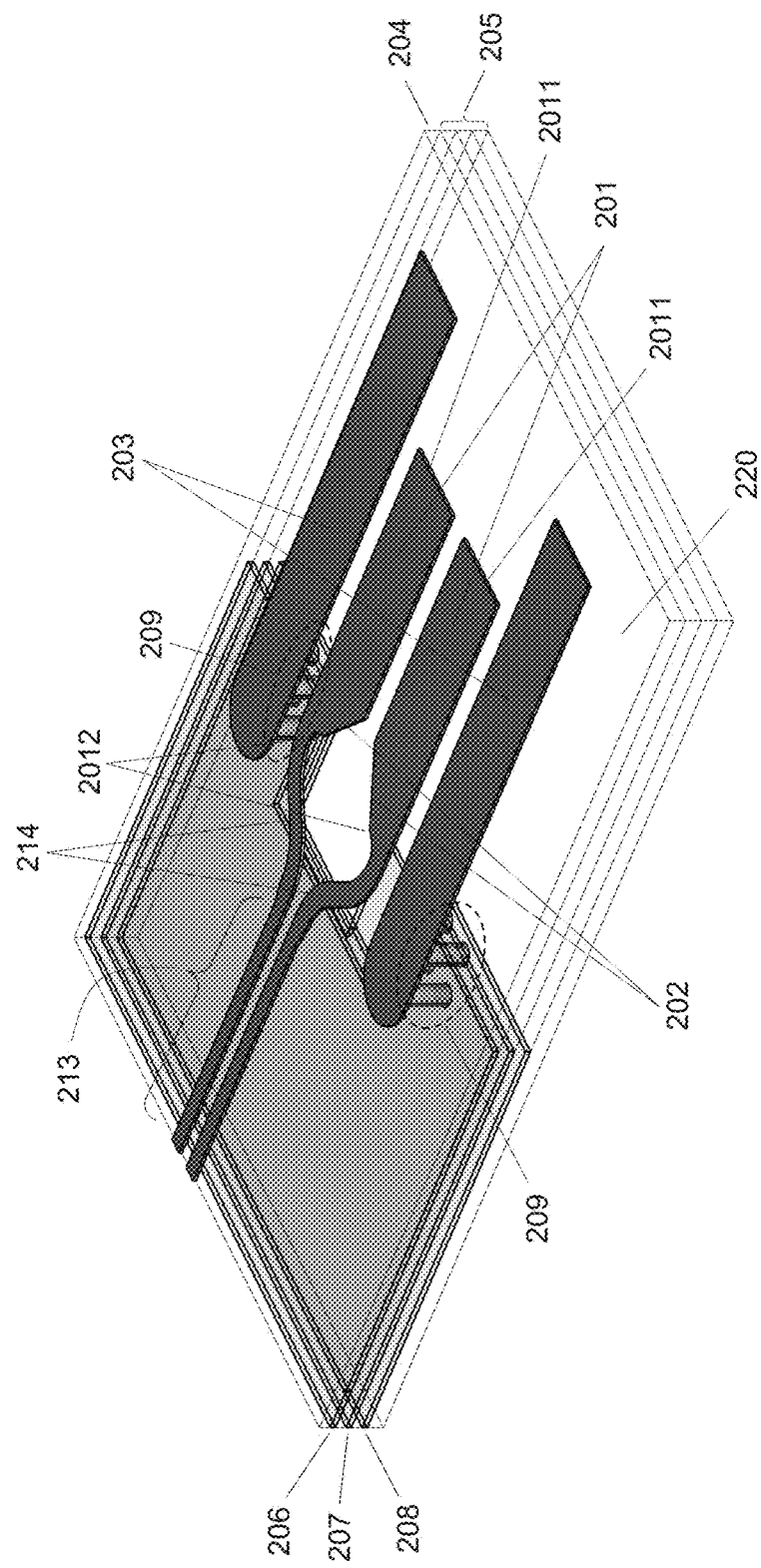
FIG. 2a is a top perspective view of the edge fingers of a multi-layer printed circuit board according to an embodiment of the present application.
Figure 2B:
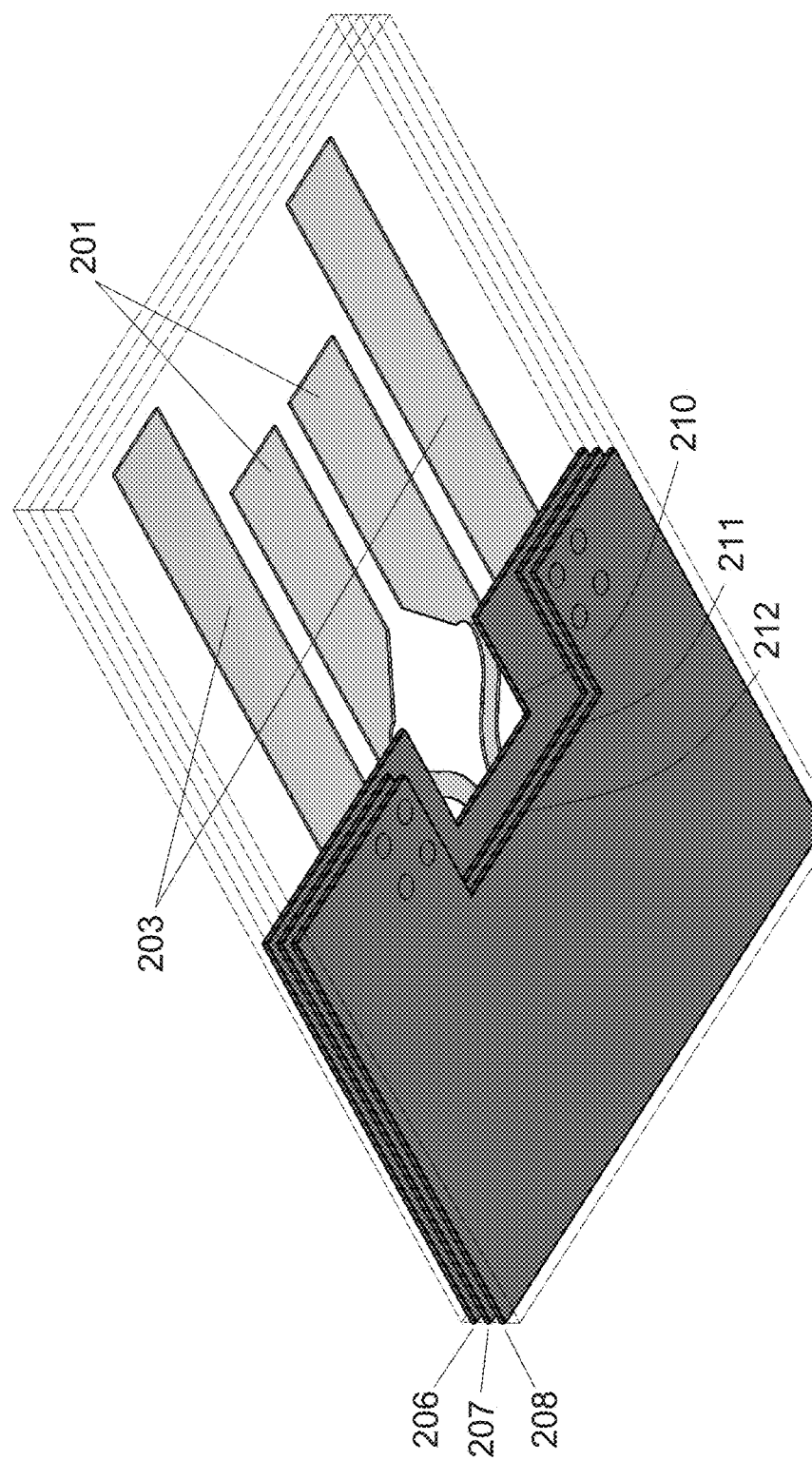
FIG. 2b is a bottom perspective view of the edge fingers of a multi-layer printed circuit board according to an embodiment of the present application.
Figure 2C:
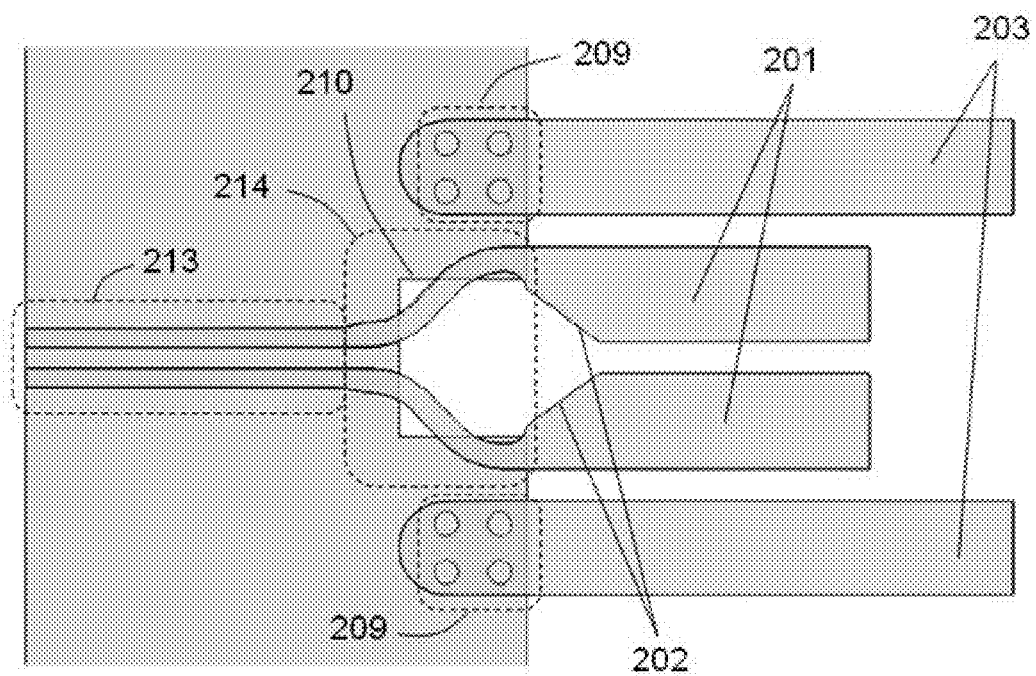
FIG. 2c is a top view of the edge fingers of a multi-layer printed circuit board according to an embodiment of the present application.
Figure 2D:
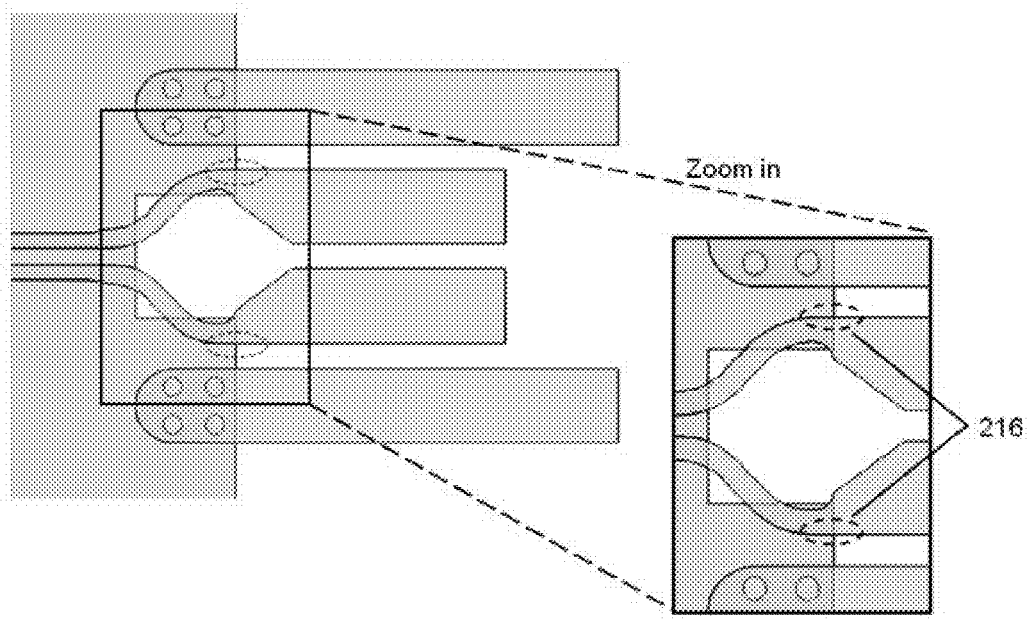
FIG. 2d is an enlarged view of the edge fingers of a multi-layer printed circuit board according to an embodiment of the present application.
Figure 2E:
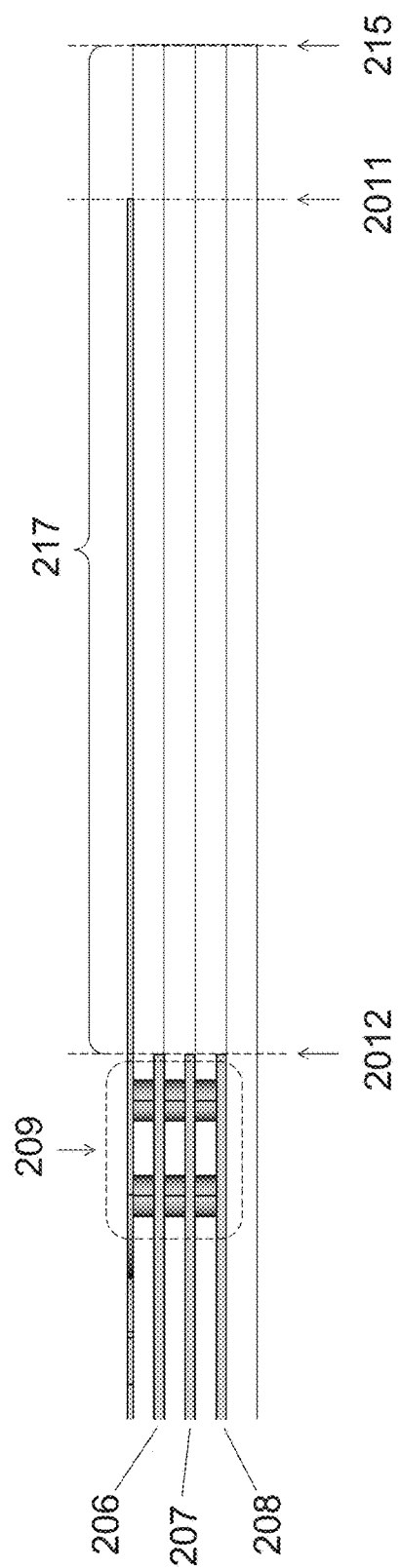
FIG. 2e is a side view of the edge fingers of a multi-layer printed circuit board according to an embodiment of the present application.

The two single-ended high-speed transmission lines 214 may join the edge fingers 201, and may align with the edge fingers 201 at outer edges 216, as shown in FIG. 2d. The edge fingers 201, the single-ended transmission line section 214 and the differential pair section 213 carry differential signal.

The metal plane 206 can be the ground reference of the single-ended transmission lines 214 and the differential pair 213, and can be located under the differential pair 213 and the single-ended transmission lines 214. The metal plane 206 can be the second layer of the PCB 104.

Ground reference of the differential signal can be provided altogether by the two longer edge fingers 203 and the metal plane 206. Vias 209 can be provided at the ends of the longer edge fingers 203 and can be connected to the metal plane 206 to ensure continuity of return-path current of the differential signal mentioned above, as shown in FIGS. 2a, 2c, 2d and 2e.

The first ground-cut area or cut-out region (also called anti-pad) 210 may be located at the leading edge of the metal plane 206, and right under the single-ended transmission lines 214. More cut-out regions 211, 212 can be applied at the same location of other metal planes 207, 208. The cut-out regions 211, 212 must be larger than the first cut-out region 210.

It is understood that the multi-layer PCB 104 is not limited to four metal planes. Metal planes 207 and 208 may be used here to represent all other inner metal planes collectively, except the second metal plane 206.

PCB substrate layer 204 may be provided between the top layer components (including the edge fingers 201, the single-ended transmission lines 214 and the differential pair 213) and the metal plane 206. PCB substrate layer 205 collectively represents all other PCB substrate layers, except the substrate layer 204 (see FIG. 2e).

The two chamfers 202 may be arranged face-to-face, and may be disposed at the corners of the edge fingers 201, as best illustrated in FIG. 2c. The chamfers 202 should be provided right next to the single-ended high-speed transmission lines 214 (see FIGS. 2c and 2d). In one embodiment, each chamfer 202 may be asymmetric and the chamfer angle may be less than 45 degrees.

Metal planes 206, 207, 208 may extend up to the trailing edges 2012 of the edge finger region 217 only. There is no metal under the edge fingers 201 and longer edge fingers 203 (see FIG. 2e).

Figure 3:
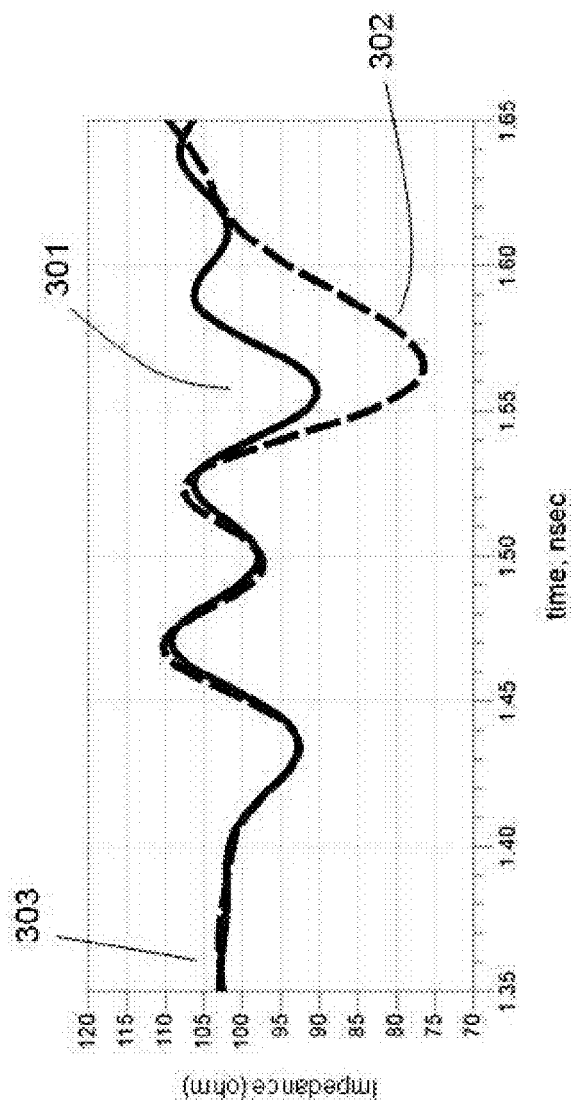
FIG. 3 is a graph with two time domain impedance curves showing the effect of the edge fingers according to the embodiment of the present application.

Two time domain impedance curves are shown in FIG. 3. Comparing with impedance of an untouched PCB at 302, a smaller dip at 301 is demonstrated in a PCB with the present PCB structure implemented. This indicates the capacitive effect found in the edge finger region 217 is effectively reduced by the PCB structure disclosed in the present application.

The edge finger structure on the PCB 104 can form capacitance between the two edge fingers 201. This capacitance can be considered as a discontinuity of a transmission line. When digital electrical signal on the transmission line is running at a very high data rate (e.g. >25 Gbps), the capacitance effect may become dominant that impedance at an edge finger region drops, and it could eventually deviate a lot from the characteristic impedance of the system transmission line.

Differential impedance of a system transmission line, in form of differential pair, is usually chosen to be 100 ohm in most of nowadays applications, and the industry accepted tolerance of differential impedance is usually +/−10%. In other words, the usual accepted range of system transmission line differential impedance is 90~110 ohm.

As demonstrated in FIG. 3, system transmission line differential impedance may be very close to 100 ohm, as pointed out by reference numeral 303. A deeper dip, as pointed out by reference numeral 302 of the dotted line indicates a big impedance drop due to the existence of strong capacitance between the edge fingers 201. More than 20 ohm deviation, as demonstrated here, is considered to be a big discontinuity that would cause unwanted signal reflections, and would distort digital signal running on the transmission line.

With the edge fingers 201, chamfers 202, and cut-out portions 210, 211, 212 of the present application, capacitance between the edge fingers 201 can be reduced effectively. Therefore, impedance of the edge fingers 201 can be brought closer to transmission line impedance, which is usually 100 ohm. It is indicated by the small dip, as pointed out by reference numeral 301 appeared in the solid line of FIG. 3. Thus, signal distortion generated due to reflections at this edge finger region can be reduced.

The chamfers 202 at the two opposite corners of the two edge fingers 201 can be applied to reduce capacitance between the two edge fingers 201. The single-ended transmission lines 214 can link the edge fingers 201 to the differential pair 213, as shown in FIG. 2c.

Ground-cut or cut-out portions 210, 211, 212 under the single-ended transmission lines 214 can further increase inductance of the region. This further compensates the large capacitance between the two edge fingers 201. Ground-cut regions 211, 212 formed on the metal planes 207, 208 must be larger than the ground-cut region 210 formed on the metal plane 206. Large capacitance between the two edge fingers 201 can be reduced. Impedance of the edge finger region 217 can be brought closer to transmission line impedance (see FIG. 3).

The edge finger capacitance issue may not be taken care in existing low data rate (14 Gbps or below) products because such kind of degradation is not significant in relatively low data rate applications. Since the PCB structure of the present application can still be realized by conventional PCB fabrication process, no additional process may be needed.

Although it has been shown and described that the PCB structure (including the edge fingers 201, the single-ended transmission lines 214, the differential pair 213, and the ground reference planes 206, 207, 208) is provided on an upper side of the multi-layer PCB, it is understood that the PCB structure can be provided on both the upper and lower sides of the multi-layer PCB.

Figure 4A:
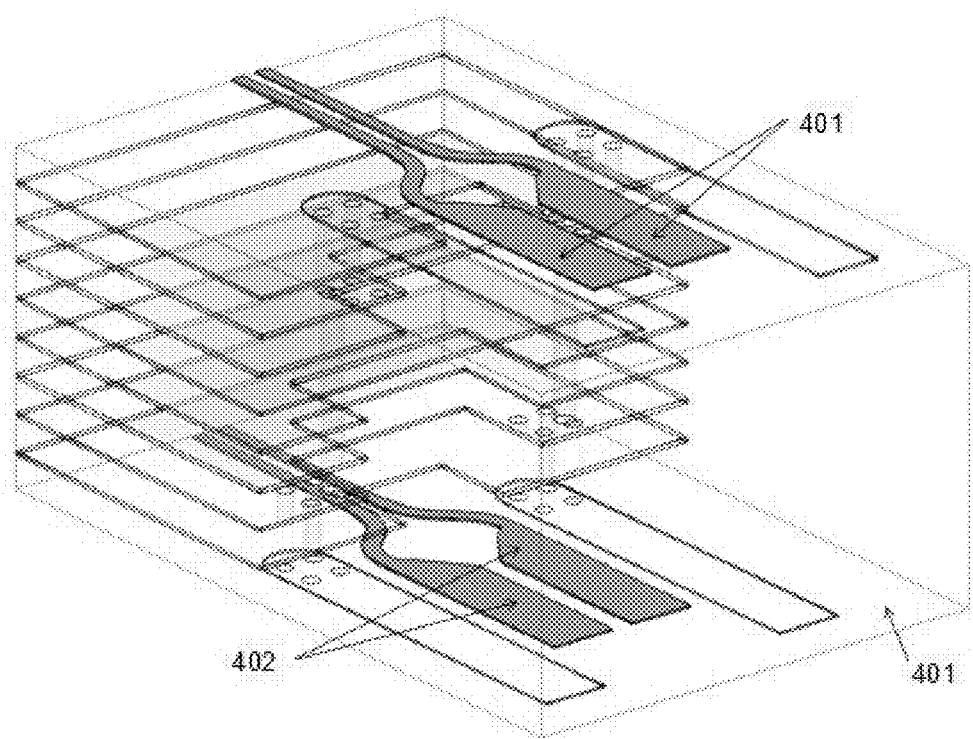
FIG. 4a is a top perspective view of double-sided edge fingers of a multi-layer printed circuit board according to an embodiment of the present application.
Figure 4B:
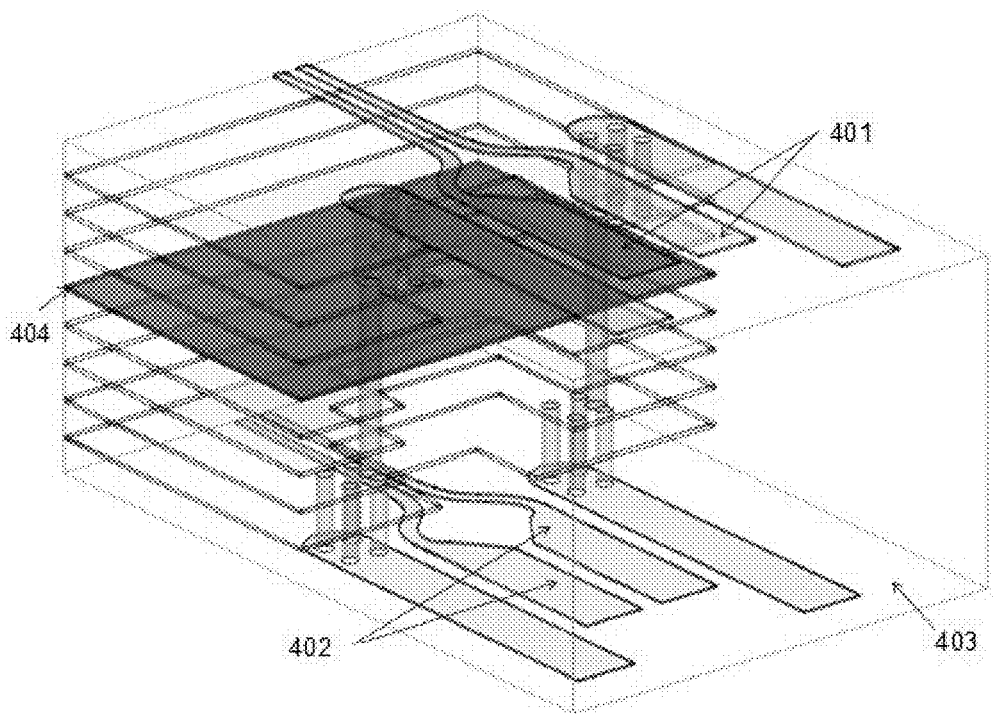
FIG. 4b is a top perspective view of the double-sided edge fingers of a multi-layer printed circuit board with the middle ground plane highlighted according to an embodiment of the present application.
Figure 4C:
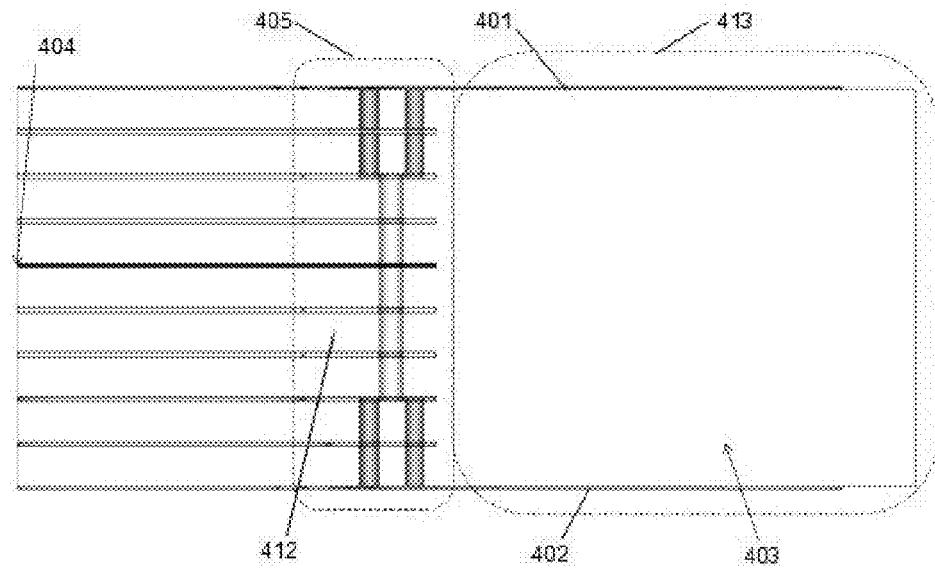
FIG. 4c is a side view of the double-sided edge fingers of a multi-layer printed circuit board with the middle ground plane highlighted according to an embodiment of the present application.

FIGS. 4a-4d show an example that two PCB structures are built on a 10-layer PCB, although it is not limited to 10 layers. It is understood that the PCB structures provided on the upper and lower sides of the PCB are similar in structure. Similar to FIG. 2a, FIG. 4a shows that top and bottom edge finger and trace structures 401, 402 carrying differential signal may be located at the top and bottom layers of the PCB respectively.

The two edge finger and trace structures 401, 402 may be symmetric about the middle ground layer 404. However, since multi-layer PCB is usually laminated into even number of layers, i.e. 2, 4, 6, etc., the upper PCB structure 410 may contain four metal layers while the lower PCB structure 411 may contain five metal layers (see FIG. 4d).

The middle ground layer 404 can be different from the ground reference planes in the upper PCB structure 410 and the lower PCB structure 411. The middle ground layer 404 may have no cut-out region. Similar to other ground reference planes, the middle ground layer may extend up to the trailing edge of the edge finger region 413. There is no metal in the edge finger portion between the two edge finger and trace structures 401, 402 (see FIG. 4c). The middle ground layer 404 between the upper PCB structure 410 and lower PCB structure 411 can work like a shield to reduce electromagnetic coupling between the two pairs of edge fingers 401, 402.

Figure 4D:
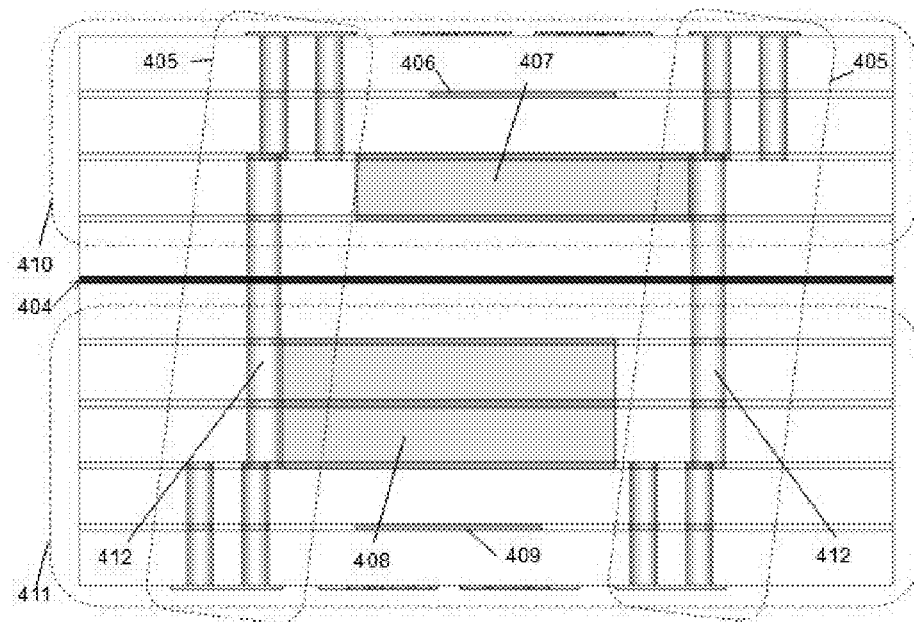
FIG. 4d is a front view of the double-sided edge fingers of a multi-layer printed circuit board showing a middle ground plane and cut-out portions according to an embodiment of the present application.

In one embodiment, the upper PCB structure 410 and the lower PCB structure 411 may be offset in a sideway direction, as depicted in FIG. 4d.

Similar to vias 209 in FIG. 2, there may be vias in the upper PCB structure 410 and the lower PCB structure 411 connecting to the longer edge fingers and ground reference planes together. Ground reference planes in the upper PCB structure 410 and the lower PCB structure 411 and the middle ground layer 404 may be connected together by vias 412.

The upper PCB structure 410, the lower PCB structure 411 and the middle ground layer 404 can be built (or laminated) among layers of PCB substrates. The PCB substrates are collectively represented by reference numeral 403.

Similar to the PCB structure in FIG. 2, appropriately cutting out and removing the ground reference planes under the single-ended transmission lines of the two edge finger and trace structures 401, 402 is needed. Ground-cut areas 406, 409 can be the cut-out regions for the first ground reference plane of the upper and lower PCB structures 410, 411 respectively. Ground-cut areas 407, 408 can be the cut-out regions for the rest of the ground reference planes of the upper and lower PCB structures 410, 411 respectively.

Ground layer 404 between the two pairs of edge fingers 410, 411 located at two sides of the PCB can also help to reduce electromagnetic coupling between the two pairs of edge fingers.

Figure 5A:
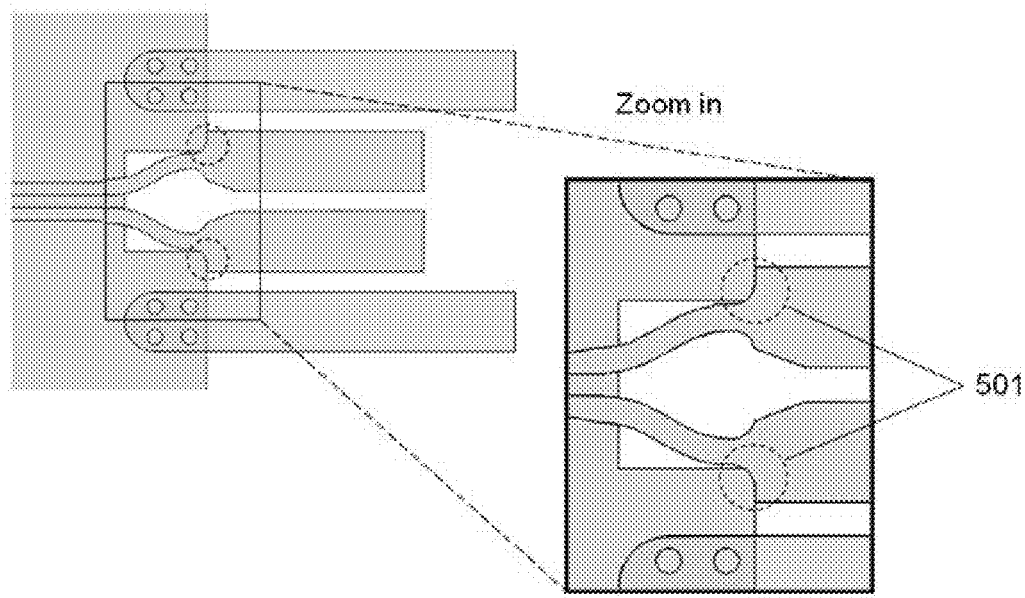
FIG. 5a is an enlarged view of the edge fingers of a multi-layer printed circuit board according to a second embodiment of the present application.
Figure 5B:
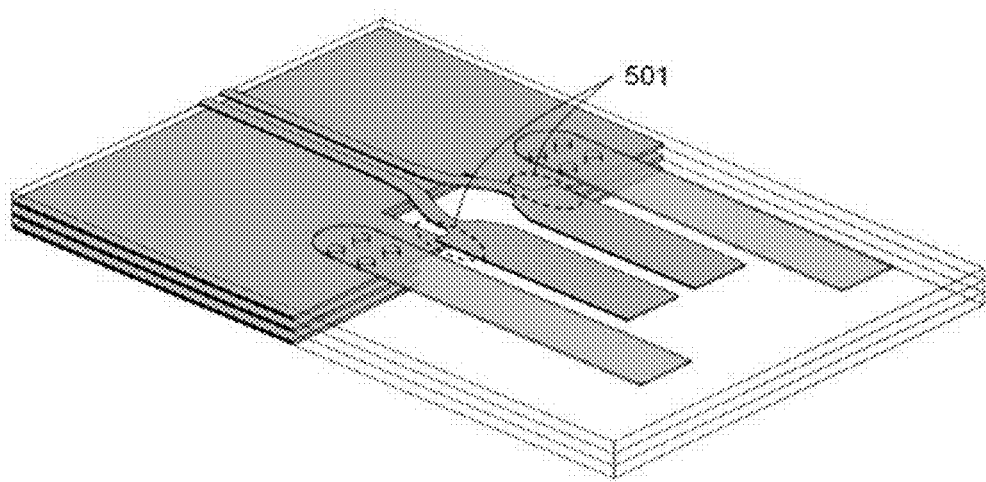
FIG. 5b is a top perspective view of the edge fingers of a multi-layer printed circuit board according to the second embodiment of the present application.
Figure 5C:
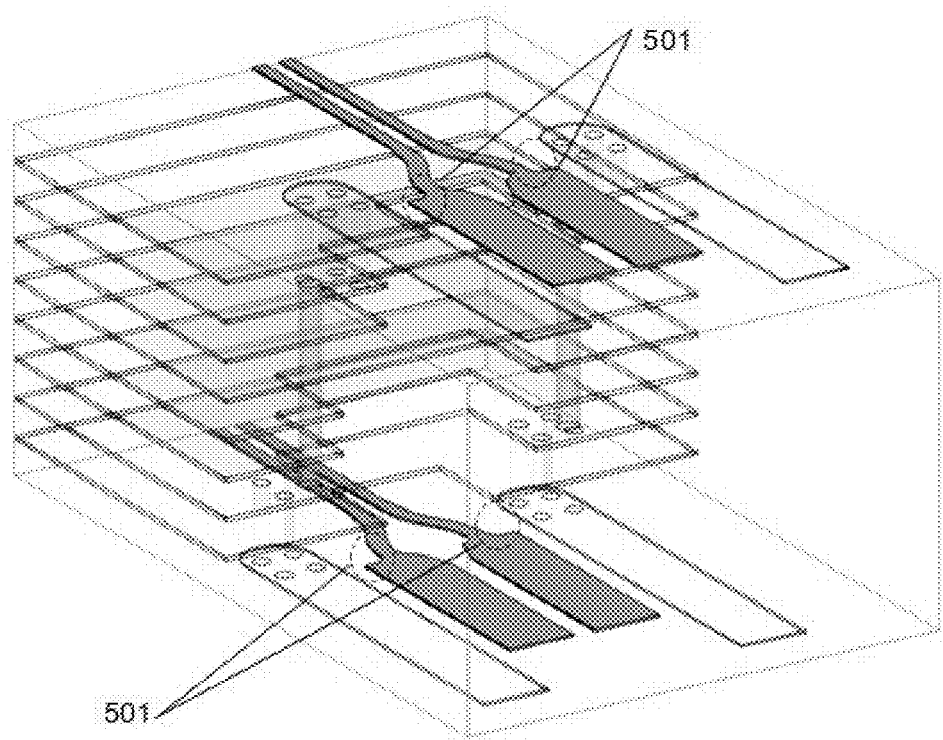
FIG. 5c is a top perspective view of double-sided edge fingers of a multi-layer printed circuit board according to the second embodiment of the present application.

FIGS. 5a-5c show another embodiment of the edge fingers which can connect to single-ended transmission lines without aligning to the side edges of the edger fingers 501. The two single-ended transmission lines may extend from the middle portions of the trailing edges of the two edge fingers respectively.

While the edge fingers of a multi-layer printed circuit board has been shown and described with particular references to a number of preferred embodiments thereof, it should be noted that various other changes or modifications may be made without departing from the scope of the appended claims.

What is claimed is:
1. A multi-layer printed circuit board comprising:
 (a) an insertion end having upper and lower surfaces;
 (b) two edge fingers provided side-by-side on one of the surfaces of the insertion end, each edge finger having a leading edge and a trailing edge;

(c) two chamfers formed at two opposite inner corners at the two trailing edges of the two edge fingers respectively;
(d) two single-ended transmission lines extending from the two trailing edges of the two edge fingers adjacent to the two chamfers respectively, and converging towards each other to form a differential pair at a distance from the trailing edges of the two edge fingers;
(e) a first ground reference plane disposed at an inner side of a plane on which the two edge fingers, the two single-ended transmission lines and the differential pair are disposed, and a leading edge of the first ground reference plane being terminated at the trailing edges of the two edge fingers, wherein a first cut-out portion is formed at the leading edge of the first ground reference plane, and disposed at an inner side of the two converging single-ended transmission lines;
(f) at least one second ground reference plane disposed at an inner side of the first ground reference plane, and a leading edge of the or each second ground reference plane being terminated at the trailing edges of the two edge fingers, wherein a second cut-out portion is formed at the leading edge of the or each second ground reference plane at an inner side of the first cut-out portion, and the second cut-out portion is larger than the first cut-out portion; and
(g) two additional edge fingers provided on the same plane of the two edge fingers, and disposed along two opposite sides of the two edge fingers respectively to form a group of four edge fingers, wherein the two additional edge fingers are longer than the two edge fingers, and are connected to the first and second ground reference planes by a plurality of vias.

2. A multi-layer printed circuit board comprising:
(a) an insertion end having upper and lower surfaces;
(b) two edge fingers provided side-by-side on one of the surfaces of the insertion end, each edge finger having a leading edge and a trailing edge;
(c) two chamfers formed at two opposite inner corners at the two trailing edges of the two edge fingers respectively;
(d) two single-ended transmission lines extending from the two trailing edges of the two edge fingers adjacent to the two chamfers respectively, and converging towards each other to form a differential pair at a distance from the trailing edges of the two edge fingers;
(e) a first ground reference plane disposed at an inner side of a plane on which the two edge fingers, the two single-ended transmission lines and the differential pair are disposed, and a leading edge of the first ground reference plane being terminated at the trailing edges of the two edge fingers, wherein a first cut-out portion is formed at the leading edge of the first ground reference plane, and disposed at an inner side of the two converging single-ended transmission lines; and
(f) two additional edge fingers provided on the same plane of the two edge fingers, and disposed along two opposite sides of the two edge fingers respectively to form a group of four edge fingers, wherein the two additional edge fingers are longer than the two edge fingers, and are connected to the first ground reference plane by a plurality of vias.

3. The multi-layer printed circuit board as claimed in claim 2, further comprising at least one second ground reference plane disposed at an inner side of the first ground reference plane, and a leading edge of the or each second ground reference plane being terminated at the trailing edges of the two edge fingers, wherein a second cut-out portion is formed at the leading edge of the or each second ground reference plane at an inner side of the first cut-out portion, and the second cut-out portion is larger than the first cut-out portion.

4. The multi-layer printed circuit board as claimed in claim 3, wherein the first and the second cut-out portions are rectangular in shape.

5. The multi-layer printed circuit board as claimed in claim 2, wherein an edge finger region below the edge fingers and between the trailing edges of the edge fingers and a leading edge of the insertion end is free of metal.

6. The multi-layer printed circuit board as claimed in claim 2, wherein the two single-ended transmission lines extend from two opposite outer corners at the trailing edges of the two edge fingers, and two opposite outer side edges of the two single-ended transmission lines are in alignment with two opposite outer side edges of the two edge fingers respectively.

7. The multi-layer printed circuit board as claimed in claim 2, wherein the two single-ended transmission lines extend from middle portions of the two trailing edges of the two edge fingers respectively.

8. The multi-layer printed circuit board as claimed in claim 2, further comprising
(a) two additional edge fingers provided side-by-side on an opposite one of the surfaces of the insertion end, each additional edge finger having a leading edge and a trailing edge;
(b) two additional chamfers formed at two opposite inner corners at the two trailing edges of the two additional edge fingers respectively; and
(c) two additional single-ended transmission lines extending from the two trailing edges of the two additional edge fingers adjacent to the two additional chamfers respectively, and converging towards each other to form an additional differential pair at a distance from the trailing edges of the two additional edge fingers.

9. The multi-layer printed circuit board as claimed in claim 8, further comprising an additional first ground reference plane disposed at an inner side of a plane on which the two additional edge fingers, the two additional single-ended transmission lines and the additional differential pair are disposed, and a leading edge of the additional first ground reference plane being terminated at the trailing edges of the two additional edge fingers.

10. The multi-layer printed circuit board as claimed in claim 9, wherein an additional first cut-out portion is formed at the leading edge of the additional first ground reference plane.

11. The multi-layer printed circuit board as claimed in claim 10, further comprising at least one additional second ground reference plane disposed at an inner side of the additional first ground reference plane, and a leading edge of the or each additional second ground reference plane being terminated at the trailing edges of the two additional edge fingers.

12. The multi-layer printed circuit board as claimed in claim 11, wherein an additional second cut-out portion is formed at the leading edge of the or each additional second ground reference plane at an inner side of the additional first cut-out portion, and the additional second cut-out portion is larger than the additional first cut-out portion.

13. The multi-layer printed circuit board as claimed in claim 12, further comprising a middle ground plane provided between the at least one second ground reference plane and the at least one additional ground reference plane, a leading edge of the middle ground plane being terminated at the trailing edges of the two additional edge fingers and being free of cut-out portion.

14. The multi-layer printed circuit board as claimed in claim 12, wherein the edge fingers, the single-ended transmission lines, the differential pair, and the first and the at least one second ground reference planes are offset from the additional edge fingers, the additional single-ended transmission lines, the additional differential pair, and the additional first and the at least one additional second ground reference planes in a sideway direction.

15. The multi-layer printed circuit board as claimed in claim 8, wherein the two additional single-ended transmission lines extend from two opposite outer corners of the two additional edge fingers, and two opposite outer side edges of the two additional single-ended transmission lines are in alignment with two opposite outer side edges of the two additional edge fingers respectively.

16. The multi-layer printed circuit board as claimed in claim 8, wherein the two additional single-ended transmission lines extend from middle portions of the two trailing edges of the two additional edge fingers respectively.

\* \* \* \* \*